United States Patent [19]

Takemura et al.

[11] Patent Number: 5,731,126
[45] Date of Patent: Mar. 24, 1998

[54] CHEMICALLY AMPLIFIED POSITIVE RESIST COMPOSITIONS

[75] Inventors: Katsuya Takemura; Junji Tsuchiya; Toshinobu Ishihara, all of Niigata-ken, Japan

[73] Assignee: Shin-Etsu Chemical Co., Ltd., Tokyo, Japan

[21] Appl. No.: 627,928

[22] Filed: Apr. 3, 1996

[30] Foreign Application Priority Data

Apr. 4, 1995 [JP] Japan ................ 7-103124
Apr. 4, 1995 [JP] Japan ................ 7-103125

[51] Int. Cl.$^6$ .................................... G03F 7/039
[52] U.S. Cl. .................. 430/270.1; 430/170; 528/10; 528/43
[58] Field of Search .................. 430/170, 270.1; 528/10, 31, 43

[56] References Cited

U.S. PATENT DOCUMENTS

| | | | |
|---|---|---|---|
| 4,600,685 | 7/1986 | Kitakohji et al. | 430/270.1 |
| 4,657,843 | 4/1987 | Fukuyama et al. | 430/270.1 |
| 4,722,881 | 2/1988 | Ueno et al. | 430/270.1 |
| 4,822,716 | 4/1989 | Onishi et al. | 430/270.1 |
| 4,981,778 | 1/1991 | Brault | 430/270.1 |
| 5,057,396 | 10/1991 | Tanaka et al. | 430/270.1 |
| 5,338,818 | 8/1994 | Brunsvold et al. | 430/207.1 |
| 5,547,808 | 8/1996 | Watanabe et al. | 430/270.1 |

*Primary Examiner*—John S. Chu
*Attorney, Agent, or Firm*—Millen, White, Zelane, & Branigan, P.C.

[57] ABSTRACT

A chemically amplified positive resist composition comprising a specific polysiloxane having a terminal silanol group protected with a trimethylsilyl group, a photoacid generator and optionally a dissolution inhibitor is provided.

20 Claims, No Drawings

CHEMICALLY AMPLIFIED POSITIVE RESIST COMPOSITIONS

BACKGROUND OF THE INVENTION

1. Field of the Invention

This invention relates to a chemically amplified positive resist composition which is highly sensitive to actinic radiation such as deep-ultraviolet, electron beam and X-ray, can be developed with alkaline aqueous solution to form a resist pattern, and is thus suitable for use in a fine patterning technique.

2. Prior Art

As the LSI technology tends toward higher integration and higher speed, further refinement of pattern rules is required. Under the circumstances, deep-ultraviolet lithography is regarded promising as fine patterning technology of the next generation. The deep-UV lithography is capable of working on the order of 0.3 to 0.4 µm. If a less light absorbing resist is used, it is possible to form a pattern having a side wall nearly perpendicular to the substrate. The deep-UV lithography is also capable of pattern transfer all at once and thus affords an advantageous throughput than the electron beam lithography. Great attention is now paid to the technique of utilizing a high illuminance KrF excimer laser as a deep-UV light source. In order to employ this technique on a mass production scale, a resist material having low light absorption and high sensitivity is desired.

To comply with the trend of LSI technology, there were recently developed new resist materials which undergo acid-catalyzed chemical amplification. See Liu et al., J. Vac. Sci. Technol., Vol. B6, 379 (1988). Because of many advantages including a sensitivity at least comparable to conventional high-sensitivity resist materials, high resolution, and high dry etching resistance, the chemically amplified resist materials are regarded promising for deep-ultraviolet lithography.

As to negative resists, a chemically amplified ternary resist material comprising a novolak resin, a melamine compound and an acid generator is commercially available from Shipley Co. under the trade name of SAL601ER7. As to positive resists, however, there have been commercially available no positive resist materials of the chemical amplification system. In the manufacture of LSIs, interconnection and gate formation can be managed using negative resists whereas the use of negative resists for contact hole formation obstructs fine processing due to fogging. Positive resist materials are superior in this regard. There is a strong demand for high performance positive resist material.

In the past, Ito et al. developed a chemically amplified positive resist by adding an onium salt to a polyhydroxystyrene resin whose hydroxyl group is protected with a tert-butoxycarbonyl (tert-BOC) group, which is known as PBOCST. See Polymers in Electronics, ACS symposium Series No. 242, American Chemical Society, Washington D.C., 1984, page 11. Since the onium salt used therein contains antimony as a metal component, the PBOCST resist is not desirable from the standpoint of preventing contamination to the substrate.

Ueno et al. reported a deep-UV, chemically amplified positive resist comprising poly(p-styreneoxytetrahydropyranyl) and a photoacid generator as having high sensitivity and high resolution. See 36th Applied Physics Society Related Joint Meeting, 1989, 1p-k-7. However, it was difficult to form a fine, high aspect ratio pattern at a high precision because of the mechanical strength thereof.

Many other reports have been made about such chemically amplified positive resist materials using novolak resins and polyhydroxystyrene as a base polymer and being sensitive to deep-UV, electron beams, and X-ray. All of them are single-layer resists. There still remain unsolved problems associated with substrate steps, standing wave resulting from optical reflection at the substrate, and difficulty to form high-aspect ratio patterns. These resist materials are unacceptable in practice.

The two-layer resist technique is recommended in order to form high-aspect ratio patterns on stepped substrates. To enable alkali development in the two-layer resist technique, polysiloxanes having a hydrophilic group such as hydroxyl and carboxyl groups are required. Since the polysiloxanes, however, have left therein hydroxyl groups each directly attached to a silicon atom (that is, silanol groups) and thus undergo crosslinking reaction in the presence of acid, it is difficult to apply such polysiloxanes to chemically amplified positive resist materials.

While polyhydroxybenzylsilsesquioxane is known as a stable alkali soluble polysiloxane, its derivatives obtained by protecting some hydroxyl groups with tert-BOC form chemically amplified silicone system positive resist materials when combined with photoacid generators as disclosed in SPIE, Vol. 1925 (1993), 377. Examples using alkali soluble polysiloxanes as a base polymer and synthesis of alkali soluble polysiloxanes are disclosed in Japanese Patent Application Kokai (JP-A) Nos. 118651/1994 and 184311/1994 (corresponding to U.S. Pat. No. 5,338,818) and Japanese Patent Publication (JP-B) No. 58446/1993 (corresponding to U.S. Pat. No. 4,745,169 and EP 204963).

More particularly, synthesis of main skeleton polysiloxanes as a base polymer can be carried out by conventional hydrolysis methods of adding a solution of a chlorosilane having a protected phenolic hydroxyl group to water. In the above-referred patent references, polysiloxanes are synthesized by using a methyl group for the protection of a phenolic hydroxyl group, for example, by hydrolyzing p-methoxybenzyldichlorosilane into p-methoxybenzylsilsesquioxane, followed by detachment of the methyl group.

The method described in JP-B 58446/1993 involves hydrolysis of chlorosilanes and condensation in the presence of alkali. Since many active silanol groups are left in the polysiloxane, condensation reaction continues even after the termination of reaction. This synthesis process is not reproducible.

In JP-A 184311/1994, the methyl group used for the protection of a phenolic hydroxyl group is detached by reacting the methyl group with boron tribromide, followed by hydrolysis. This method is complex in reaction operation because the boron tribromide reagent must be carefully handled and the reaction temperature must be cryogenic. According to our experiment, the polysiloxane obtained by this method raises a problem of shelf instability when a resist material is prepared therefrom. After storage, a resist solution is no longer applicable as a resist material because many particles generate in the resist solution.

JP-A 118651/1994 discloses that the condensation reaction of polysiloxanes is preferably heat condensation under neutral conditions and in vacuum because the process is well reproducible and that the methyl group with which a phenolic hydroxyl group is protected can be readily detached by reacting it with trimethylsilyl iodide and then effecting hydrolysis. More specifically, an alkali soluble polysiloxane is obtained by hydrolyzing p-methoxybenzylchlorosilane whose phenolic hydroxyl group is protected with a methyl group, subjecting the resulting polysiloxane to heat condensation under vacuum, and reacting it with trimethylsilyl iodide, followed by hydrolysis. The polysiloxane obtained by this method still fails to provide satisfactory shelf stability when a resist material is prepared therefrom.

SUMMARY OF THE INVENTION

An object of the present invention is to provide a chemically amplified positive resist composition having high sensitivity, high resolution, process adaptability, and shelf stability and especially suitable for use as two-layer resist material.

We have found that a resist composition having improved shelf stability is obtained using a polysiloxane (A) of the following compositional formula (1) or a polysiloxane (B) of the following compositional formula (2) in which the terminal silanol groups of polysiloxane (A) or (B) are protected with trimethylsilyl groups as a base polymer. Especially when an onium salt of the following general formula (6) is used as a photoacid generator which decomposes to generate an acid upon exposure to radiation, there is obtained a chemically amplified positive silicone base resist composition which is developable with alkali aqueous solution, has high sensitivity, high resolution, process adaptability, and shelf stability, and is especially suitable for use as an upper layer material in a two-layer resist technique.

Polysiloxane (A):

$$R^1(OSiMe_3)_aSiO_{(3-a)/2} \quad (1)$$

wherein $R^1$ is a monovalent organic group selected from the group consisting of

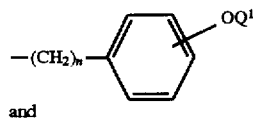

and

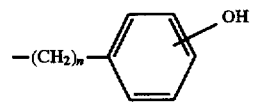

with proviso that at least one of the $R^1$s is

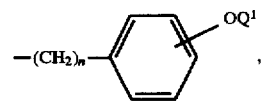

Me is a methyl group, $Q^1$ is an acid labile group, letter a is a positive number in the range of from 0.001 to 0.05, and letter n is equal to 1, 2 or 3.

Polysiloxane (B):

$$R^2(OSiMe_3)_aSiO_{(3-a)/2} \quad (2)$$

wherein $R^2$ is a monovalent organic group selected from the group consisting of

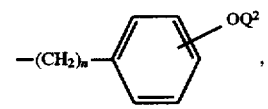

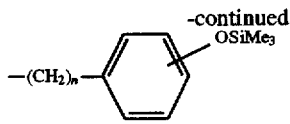

and

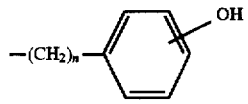

with proviso that at least one of the $R^2$s is

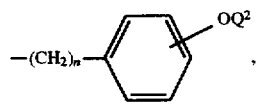

and at least one of the $R^2$s is

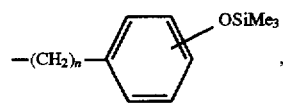

Me is a methyl group, $Q^2$ is an acid labile group excluding a trimethylsilyl group, letter a is a positive number in the range of from 0.001 to 0.05, and letter n is equal to 1, 2 or 3.

Onium salt:

$$(R)_mJM \quad (11)$$

wherein R is independently selected from substituted or unsubstituted aromatic groups, J is sulfonium or iodonium, M is a toluenesulfonate or trifluoromethanesulfonate group, and letter m is equal to 2 or 3.

As previously mentioned, a resist composition containing as a base polymer an alkali soluble polysiloxane obtained by the conventional synthetic method has the problem that many particles generate in a resist solution thereof during storage so that the resist solution is no longer applicable as a resist material. Studying the cause of this phenomenon, we carried out $^{29}$Si-NMR analysis to find that the polysiloxane obtained by the conventional method has many silanol groups left therein. During storage of the resist composition, the residual silanol groups condense to form a gel which manifests itself as particles. For example, the alkali soluble polysiloxane obtained by the synthetic method of JP-A 118651/1994 is better than those polysiloxanes by other methods with respect to the shelf stability of a resist composition prepared therefrom, but still has silanol groups left therein as confirmed by $^{29}$Si-NMR analysis. Residual silanol groups in a polysiloxane can be trimethylsilylated with trimethylsilyl iodide, but to such an extent that a noticeable number of silanol groups are left in the alkali soluble polysiloxane. A resist composition prepared therefrom is thus insufficient in shelf stability.

We studied from various aspects the method of synthesizing an alkali soluble polysiloxane while reducing residual silanol groups at the end thereof which would adversely affect the shelf stability of a resist composition prepared from the polysiloxane. Further making investigations on an alkali soluble polysiloxane having good shelf stability, we have found that an alkali soluble polysiloxane having a significantly reduced number of residual silanol groups as compared with the conventional methods can be synthesized using the reaction scheme (a) shown below.

We have found that by reacting a polysiloxane composed of the recurring unit of the general formula (3) which is obtained by hydrolysis of p-methoxybenzyltrichlorosilane or the like and thermal condensation of the resulting hydrolysate condensate with hexamethyldisilazane (HMDS) or trimethylsilyl chloride (Me₃SiCl) for trimethylsilylating the hydrogen atom of a silanol group thereof, thereby obtaining a polysiloxane composed of the recurring unit of the general formula (4) and having a terminal silanol group of its backbone protected with a trimethylsilyl group; reacting the polysiloxane of formula (4) with trimethylsilyl iodide (Me₃SiI), thereby obtaining a polysiloxane composed of the recurring unit of the general formula (5) wherein a trimethylsilyl group is substituted for the methyl group protecting the phenolic hydroxyl group; and hydrolyzing the polysiloxane of formula (5) to introduce a phenolic hydroxyl group, there is obtained a polysiloxane composed of the recurring unit of the general formula (6) wherein the number of residual silanol groups is significantly reduced as compared with alkali soluble polysiloxanes obtained by the conventional methods.

Reaction scheme (a):

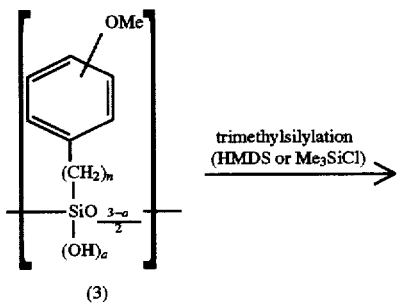

(3)

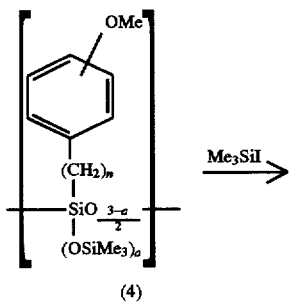

(4)

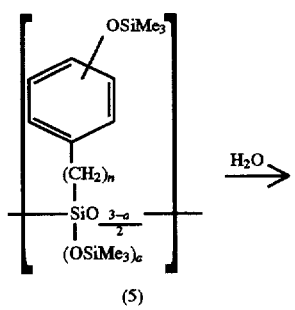

(5)

Reaction scheme (a):
-continued

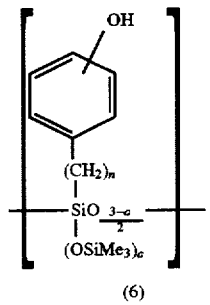

(6)

In the formulae, Me, a and n are as defined above.

We have also found that by reacting a polysiloxane composed of the recurring unit of the general formula (7), which is so designated for an orderly description of reaction scheme (b) although it is identical with formula (3), with trimethylsilyl iodide (Me₃SiI) for protecting a terminal silanol group of its backbone with a trimethylsilyl group and also replacing the methyl group protecting a phenolic hydroxyl group by a trimethylsilyl group, thereby obtaining a polysiloxane composed of the recurring unit of the general formula (8); hydrolyzing the polysiloxane composed of the recurring unit of formula (8) to introduce a phenolic hydroxyl group, thereby obtaining a polysiloxane composed of the recurring unit of the general formula (9); and reacting the polysiloxane of formula (9) with hexamethyldisilazane (HMDS) or trimethylsilyl chloride (Me₃SiCl) for trimethylsilylating again for substituting trimethylsilyl groups for the residual silanol groups and some of phenolic hydroxyl groups resulting from hydrolysis, there is obtained a polysiloxane composed of the recurring units of the general formulae (10a) and (10b) wherein the number of residual silanol groups is significantly reduced as compared with alkali soluble polysiloxanes obtained by the conventional methods.

Reaction scheme (b):

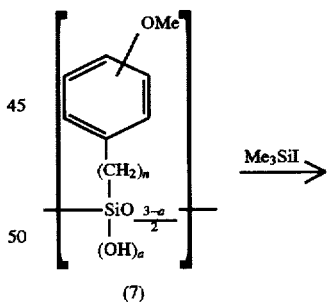

(7)

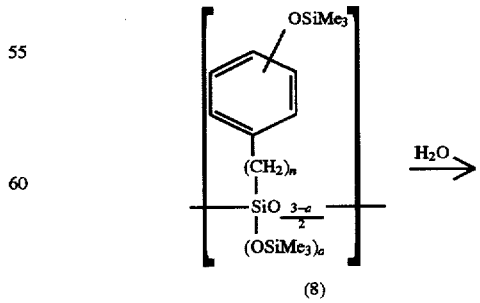

(8)

Reaction scheme (b):
-continued

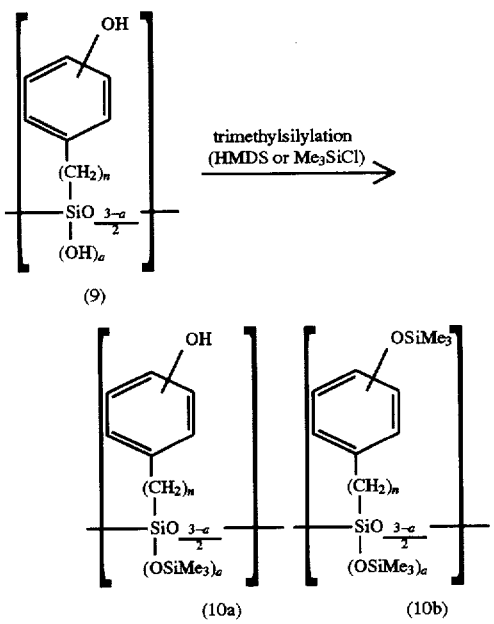

wherein Me, a and n are as defined above.

The alkali soluble polysiloxanes obtained by the above-mentioned conventional and inventive synthetic methods are summarized below.

(1) The alkali soluble polysiloxane obtained by reacting a polysiloxane having a phenolic hydroxyl group protected with a methyl group with boron tribromide, followed by hydrolysis. (JP-A 184311/1994)

(2) The alkali soluble polysiloxane obtained by reacting a polysiloxane having a phenolic hydroxyl group protected with a methyl group with trimethylsilyl iodide, followed by hydrolysis. (JP-A 118651/1994)

(3) The alkali soluble polysiloxane obtained by hydrolyzing p-methoxybenzyltrichlorosilane or the like, effecting heat condensation, trimethylsilylating with hexamethyldisilazane or Me$_3$SiCl for protecting residual silanol groups, and reacting the methyl group protecting the phenolic hydroxyl group with trimethylsilyl iodide, followed by hydrolysis. (reaction scheme (a))

(4) The alkali soluble polysiloxane obtained by hydrolyzing p-methoxybenzyltrichlorosilane or the like, effecting heat condensation, reacting with trimethylsilyl iodide for trimethylsilylating for protecting residual silanol groups and for trimethylsilylating the methyl group protecting the phenolic hydroxyl group, effecting hydrolysis, and trimethylsilylating again the residual silanol groups and some of phenolic hydroxyl groups with hexamethyldisilazane or Me$_3$SiCl. (reaction scheme (b))

A $^{29}$Si-NMR analysis of these polysiloxanes revealed that the amount of residual silanol groups is minimum in polysiloxane (4), next in polysiloxane (3), modest in polysiloxane (2), and maximum in polysiloxane (1). The amounts of residual silanol groups in polysiloxanes (4) and (3) are especially small. It was found that among these four alkali soluble polysiloxanes, polymers (3) and (4) are best in shelf stability when they are used as a base polymer of a resist composition after protecting with an acid labile group such as a tert-butoxycarbonyl group. That is, polysiloxanes of formulae (1) and (2) obtained by the inventive methods mentioned above wherein some of phenolic hydroxyl groups of alkali soluble polysiloxanes of formulae (6), (10a) and (10b) are replaced by acid labile groups afford improved shelf stability when used as a base polymer of a resist composition.

DETAILED DESCRIPTION OF THE INVENTION

According to the present invention, the chemically amplified positive resist composition contains a polysiloxane (A) or (B) as an alkali soluble resin. The composition may be used as either a two-component resist composition when it contains a polysiloxane (A) and/or (B) and a photoacid generator or a three-component resist composition when it further contains a dissolution inhibitor.

The polysiloxane (A) is represented by the general compositional formula (1). The terminal silanol groups of the polysiloxane (A) are protected with trimethylsilyl groups.

$$R^1(OSiMe_3)_a SiO_{(3-a)/2} \tag{1}$$

wherein R$^1$ is a monovalent organic group selected from the group consisting of

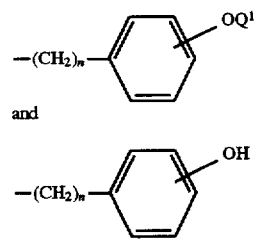

with proviso that at least one of the R$^1$s is

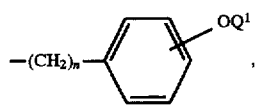

Me is a methyl group, Q$^1$ is an acid labile group, letter a is a positive number in the range of from 0.001 to 0.05, and letter n is equal to 1, 2 or 3.

Examples of the acid labile group represented by Q$^1$ include tert-butyl, tert-butoxycarbonyl and tert-butoxycarbonylmethyl groups, with the tert-butoxycarbonyl group being preferred.

Letter a is a positive number in the range of 0.001≦a≦0.05. The OSiMe$_3$ groups block the terminals of the polysiloxane (A).

R$^1$ is a monovalent organic group selected from the group consisting of

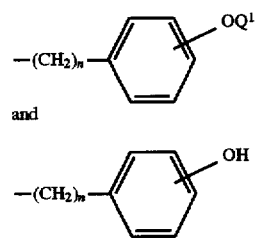

with proviso that at least one of the R¹s is

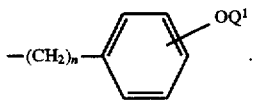

Preferably, 5 to 50 mol %, especially 10 to 30 mol % of the R¹s is

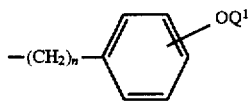

and the residue of the R¹s is

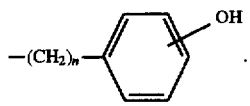

The polysiloxane (A) can be represented by the following general formula (1'):

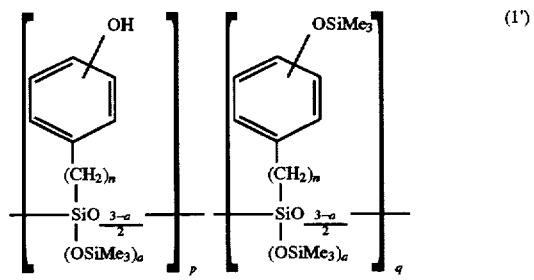

wherein Me, Q¹, a and n are the same meaning as above.

In formula (1'), $p \geq 0$ and $q > 0$. Preferably, q/(p+q) is 0.05 to 0.5, more preferably 0.1 to 0.3. While polysiloxanes (A) show low absorption to a KrF excimer laser beam, polysiloxanes wherein q/(p+q) is less than 0.05 would provide minimal dissolution inhibition effect and thus require to add dissolution inhibitors. Polysiloxanes wherein q/(p+q) is more than 0.5 would be drastically reduced in solubility in alkali solution and eliminate a need for dissolution inhibitors, but sometimes extremely reduced in sensitivity to commonly used developers.

The polysiloxane (A) preferably has a weight average molecular weight Mw of 5,000 to 50,000, especially 5,000 to 10,000. Polysiloxanes with Mw of less than 5,000 would be undesirably resistant to plasma and be less effective for dissolution inhibition to alkali solution whereas polysiloxanes with Mw of more than 50,000 would be less soluble in commonly used resist solvents.

The polysiloxane (A) can be prepared by the following synthetic method according to reaction scheme (a).

First, a polysiloxane composed of the recurring unit of the general formula (3) is obtained by hydrolyzing p-methoxybenzyltrichlorosilane or the like and effecting thermal condensation of the resulting hydrolysate condensate. The polysiloxane composed of the recurring unit of formula (3) is then trimethylsilylated at the end of its backbone for the protection of a silanol group, obtaining a polysiloxane composed of the recurring unit of the general formula (4). This trimethylsilylation is preferably carried out by dissolving the polysiloxane in an organic solvent such as toluene and adding hexamethyldisilazane as a silylating agent thereto. Preferred reaction conditions include a temperature of 0° C. to room temperature and a time of about 2 to 5 hours. This process is advantageous in that the product can be isolated simply by stripping off the reaction solvent in vacuum at the end of reaction because no by-product ammonia is left in the reaction system at the end of trimethylsilylation. That is, desired trimethylsilylation can be readily accomplished. It is noted that trimethylsilylation can also be carried out by dissolving the polysiloxane in an organic solvent and reacting it with trimethylsilyl chloride in the presence of a base although removal of the resultant hydrochloride salt is sometimes difficult. Especially an attempt to separate the hydrochloride salt by dissolving in water has the likelihood that the trimethylsilyl group be hydrolyzed to regenerate a silanol group in the polymer. It is therefore recommended to use the above-mentioned process using hexamethyldisilazane. By reacting the polysiloxane (3) with hexamethyldisilazane or trimethylsilyl chloride for the protection of a silanol group at the end of its backbone, there can be eventually obtained a polysiloxane (A) having a minimal number of residual silanol groups.

Next, the polysiloxane composed of the recurring unit of formula (4) having the hydrogen atom of a terminal silanol group in its backbone protected with a trimethylsilyl group is reacted with trimethylsilyl iodide for substituting a trimethylsilyl group for the methyl group which has been introduced to protect the phenolic hydroxyl group, thereby obtaining a polysiloxane composed of the recurring unit of the general formula (5). This trimethylsilylation is preferably carried out by adding dropwise trimethylsilyl iodide to the polysiloxane in an organic solvent. Preferred reaction conditions include a temperature of 20° to 30° C. and a time of about 8 to 10 hours.

Next, hydrolysis is carried out to detach the trimethylsilyl group protecting the phenolic hydroxyl group, to thereby restore the phenolic hydroxyl group, obtaining a polysiloxane composed of the recurring unit of the general formula (6). Hydrolysis may be carried out under well-known desilylation conditions, for example, by adding water to the reaction system while carefully controlling exothermic reaction by water cooling of the system at a temperature of 30° to 45° C.

Finally, the phenolic hydroxyl group in the polysiloxane composed of the recurring unit of formula (6) is partially replaced by an acid labile group in the following manner. For example, a tert-butoxycarbonyl group may be readily introduced by reacting the polysiloxane with di-tert-butyl dicarbonate in a pyridine solution. A tert-butoxycarbonylmethyloxy group may be introduced by reacting the polysiloxane with tert-butyl bromoacetate in the presence of a base. A tert-butoxy group may be introduced by reacting the polysiloxane with tert-butyl alcohol in the presence of trifluoroacetic anhydride.

Reaction scheme (a):

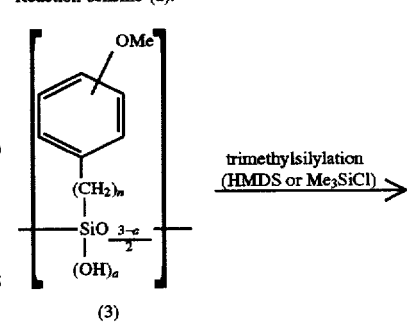

Reaction scheme (a):

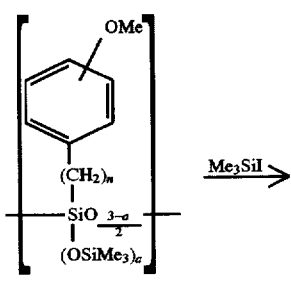

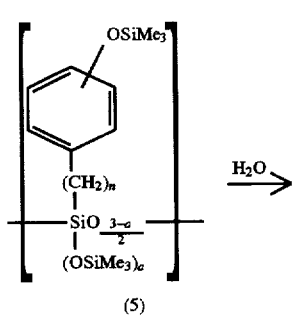

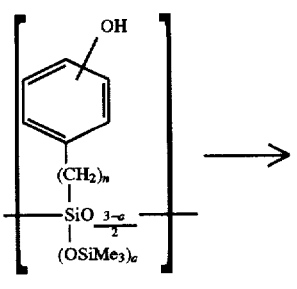

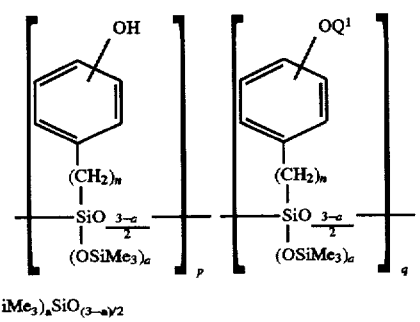

or

R¹(OSiMe₃)ₐSiO₍₃₋ₐ₎/₂  (1)

In the formula, R¹, Me, Q¹, a, p, q, and n are as defined above.

The polysiloxane (B) is represented by the general formula (2). The terminal silanol groups of polysiloxane (B) are blocked with trimethylsilyl groups.

R²(OSiMe₃)ₐSiO₍₃₋ₐ₎/₂  (2)

wherein R² is a monovalent organic group selected from the group consisting of

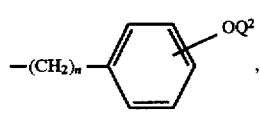

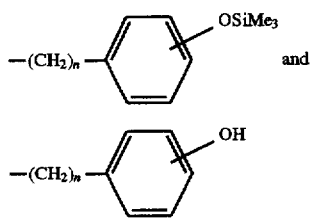

with proviso that at least one of R²s is

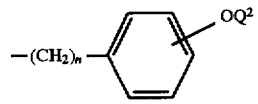

and at least one of the R²s is

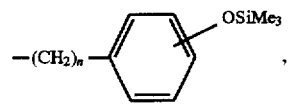

Me is a methyl group, Q² is an acid labile group excluding a trimethylsilyl group, letter a is a positive number in the range of from 0.001 to 0.05, and letter n is equal to 1, 2 or 3.

Examples of the acid labile group represented by Q² include tert-butyl, tert-butoxycarbonyl and tert-butoxycarbonylmethyl groups, with the tert-butoxycarbonyl group being preferred.

Letter a is a positive number in the range of 0.001≦a≦0.05. The OSiMe₃ groups block the terminals of the polysiloxane (B).

R² is a monovalent organic group selected from the group consisting of

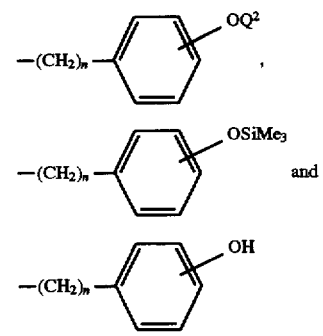

with proviso that at least one of the R²s is

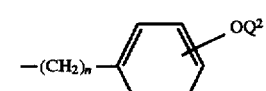

and at least one of the R²s is

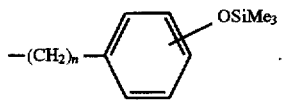

Preferably, 5 to 50 mol %, especially 10 to 30 mol % of the R²s is

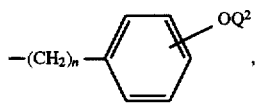

and 5 to 50 mol %, especially 10 to 20 mol % of R²s is

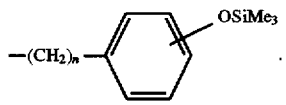

The residue of R²s is

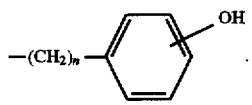

The polysiloxane (B) can be represented by the following general formula (2'):

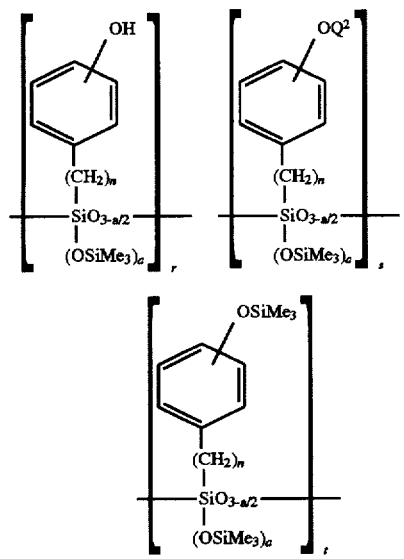

(2')

wherein Me, Q², a and n are the same meaning as above.

In formula (2'), r≧0, s>0 and t>0. s/(r+s+t) is 0.05 to 0.5, more preferably 0.1 to 0.3. While polysiloxanes (B) show low absorption to a KrF excimer laser beam, polysiloxanes wherein s/(r+s+t) is less than 0.05 would provide minimal dissolution inhibition effect and thus require to add dissolution inhibitors. Polysiloxanes wherein s/(r+s+t) is more than 0.5 would be drastically reduced in solubility in alkali solution and eliminate a need for dissolution inhibitors, but sometimes extremely reduced in sensitivity to commonly used developers.

Letter t represents the introduction ratio of a trimethylsilyl group into the phenolic hydroxyl group in 5 polysiloxane (B). t/(r+s+t) preferably ranges from 0.5 to 0.05, more preferably from 0.2 to 0.1. The amount of a trimethylsilyl group introduced may be adjusted by varying the amount of a trimethylsilylating agent added relative to the polysiloxane composed of the following general formula (9). With t/(r+s+t) of less than 0.05, residual silanol groups would not be fully protected, failing to improve the shelf stability of a resist composition prepared from a polysiloxane of formula (2). With t/(r+s+t) of more than 0.5, the resulting resist composition would be less sensitive.

The polysiloxane (B) preferably has a weight average molecular weight Mw of 5,000 to 50,000, especially 5,000 to 10,000. Polysiloxanes with Mw of less than 5,000 would be undesirably resistant to plasma and be less effective for dissolution inhibition to alkali solution whereas polysiloxanes with Mw of more than 50,000 would be less soluble in commonly used resist solvents.

The polysiloxane (B) can be prepared by the following synthetic method according to reaction scheme (b).

First, a polysiloxane composed of the recurring unit of the general formula (7)=formula (3) is obtained by hydrolyzing p-methoxybenzyltrichlorosilane or the like and effecting thermal condensation of the resulting hydrolysate condensate. The polysiloxane composed of the recurring unit of formula (7) is then reacted with trimethylsilyl iodide for protecting a terminal silanol group of its backbone and trimethylsilylating the methyl group which has been introduced to protect a phenolic hydroxyl group, thereby obtaining a polysiloxane composed of the recurring unit of the general formula (8). This trimethylsilylation is preferably carried out by dissolving the polysiloxane in an organic solvent such as acetonitrile and adding dropwise trimethylsilyl iodide thereto. Preferred reaction conditions include a temperature of 20° to 30° C. and a time of about 8 to 10 hours.

Next, hydrolysis is carried out to detach the trimethylsilyl group protecting the phenolic hydroxyl group, to thereby restore a phenolic hydroxyl group, obtaining a polysiloxane composed of the recurring unit of the general formula (9). Hydrolysis may be carried out under well-known desilylation conditions, for example, by adding water to the reaction system while carefully controlling exothermic reaction by water cooling of the system at a temperature of 30° to 45° C.

Further, the polysiloxane (9) is trimethylsilylated again to produce a polysiloxane composed of the recurring units of formulae (10a) and (10b). This trimethylsilylation is preferably carried out by dissolving the polysiloxane in an organic solvent such as toluene and adding hexamethyldisilazane as a silylating agent thereto. Preferred reaction conditions include a temperature of 0° C. to room temperature and a time of about 2 to 5 hours. This process is advantageous in that the product can be isolated simply by stripping off the reaction solvent in vacuum at the end of reaction because no by-product ammonia is left in the reaction system at the end of trimethylsilylation. That is, desired trimethylsilylation can be readily accomplished. It is noted that trimethylsilylation can also be carried out by dissolving the polysiloxane in an organic solvent and reacting it with trimethylsilyl chloride in the presence of a base although removal of the resultant hydrochloride salt is sometimes difficult. Especially an attempt to separate the hydrochloride salt by dissolving in water has the likelihood that the trimethylsilyl group would be hydrolyzed to regenerate a silanol group in the polymer. It is therefore recommended to use the above-mentioned process using hexamethyldisilazane. The amount of a trimethylsilyl group introduced into the phenolic hydroxyl group by re-trimethylsilylation may be controlled by a choice of reaction conditions and the amount of a silylating agent such as hexamethyldisilazane charged.

Finally, the phenolic hydroxyl group in the polysiloxane (10) is partially replaced by an acid labile group in the following manner. For example, a tert-butoxycarbonyl group may be readily introduced by reacting the polysiloxane with di-tert-butyl dicarbonate in a pyridine solution. A tert-butoxycarbonylmethyloxy group may be introduced by reacting the polysiloxane with tert-butyl bromoacetate in the presence of a base. A tert-butoxy group may be introduced by reacting the polysiloxane with tert-butyl alcohol in the presence of trifluoroacetic anhydride.

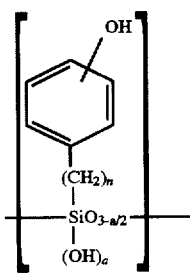

(9a)

In the formula, a and n are as defined above.

Reaction scheme (b):

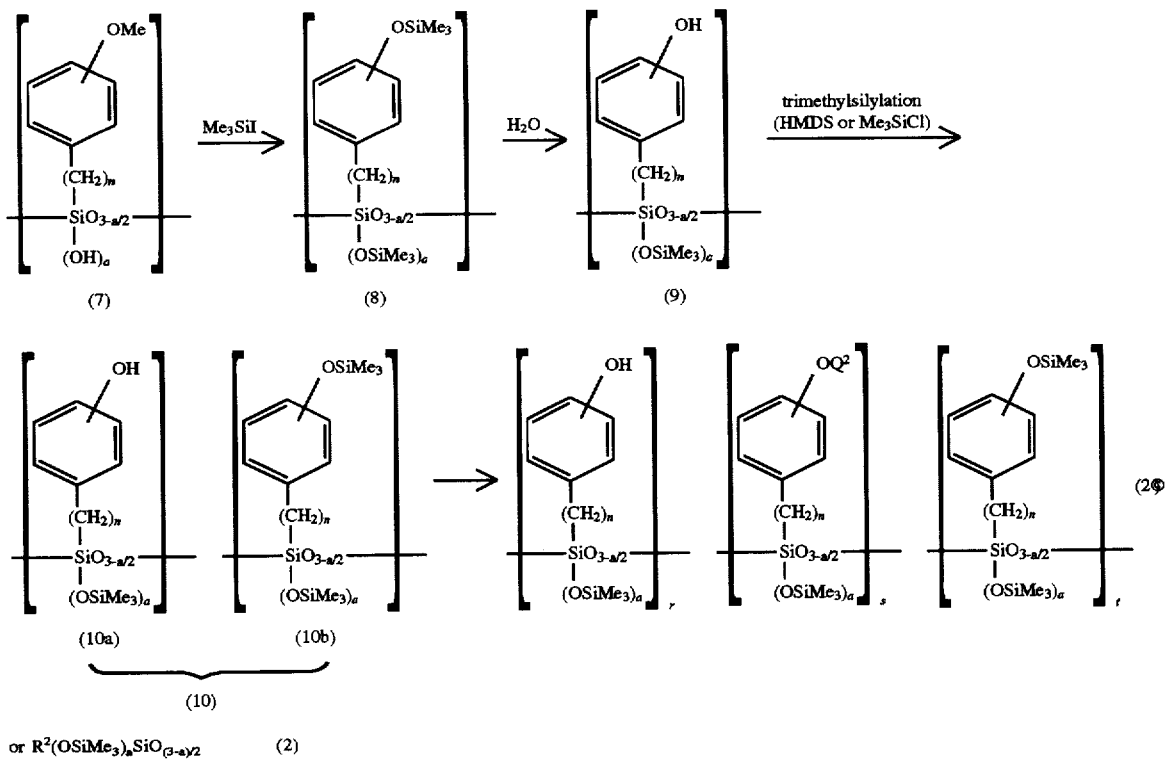

In the formulae, $R^2$, Me, $Q^2$, a, r, s, t, and n are as defined above.

It is noted in connection with reaction scheme (b) that all the terminal silanol groups of the polysiloxane (7) are not protected with trimethylsilyl groups during reaction between the polysiloxane (7) and trimethylsilyl iodide, and some, though very few, of the terminal trimethylsilyl groups of the polysiloxane chain are deprotected during hydrolysis of the polysiloxane (8). As a consequence, a compound composed of the recurring unit of the following formula (9a) is left in the intermediate product or compound (9).

Reaction scheme (b) ensures that such residual silanol groups be protected with trimethylsilyl groups by trimethylsilylating the intermediate product with hexamethyldisilazane or trimethylsilyl chloride. Then the final product or compound (10) is substantially free of residual silanol groups. The polysiloxane (B) of formula (2) obtained therefrom is also substantially free of residual silanol groups.

In this regard, it is very difficult to quantitatively determine the amount of residual silanol groups attributable to the polymer (9a). It is also difficult to protect only residual silanol groups with trimethylsilyl groups in a quantitative manner.

Therefore, in order to fully protect residual silanol groups, reaction must be done with an excess of the trimethylsilylating agent. Naturally, some phenolic hydroxyl groups are trimethylsilylated. Where phenolic hydroxyl groups are replaced by trimethylsilyl groups as in formula (2), a resist composition containing such a polysiloxane as a base polymer is highly stable during shelf storage. Where a polysiloxane having phenolic hydroxyl groups protected with trimethylsilyl groups is used as a base polymer in a resist composition, the resulting resist film is free from a problem of resolution because, like acid labile groups such as tert-butoxycarbonyl groups, these trimethylsilyl groups are deprotected by the acid generated by the photoacid generator upon exposure. If phenolic hydroxyl groups are not protected with trimethylsilyl groups, but with only acid labile groups, for example, then the proportion of phenolic hydroxyl groups to be protected must be increased in order to exert the same shelf stability effect as by the combination with trimethylsilyl groups. A resist composition prepared from such a polysiloxane suffers from losses of sensitivity and resolution. Also, if a tetrahydropyranyl group is used instead of the trimethylsilyl group, the resultant resist composition also suffers from losses of sensitivity and resolution because removal of the protective group in the exposed area of the resist is difficult. Further, if some of phenolic hydroxyl groups are protected with only trimethylsilyl groups, it is difficult to improve the resolution of a resist composition and it is necessary to introduce acid labile groups. Accordingly, the soluble polysiloxane of formula (2) having some of the phenolic hydroxyl groups protected with trimethylsilyl groups and acid labile groups is effective as a base polymer which is very simple to prepare and affords a resist composition having very high shelf stability, high sensitivity, and high resolution.

In the resist composition of the invention, the polysiloxane (A) or (B) is preferably used in an amount of at least 55% by weight, especially at least 80% by weight of the total weight of all components of two or three-component system compositions (excluding the solvent). A resist composition with a polysiloxane content of less than 55% would be less effective to coat or form a relatively weak resist film from its solution.

The resist composition of the invention favors to use as the photoacid generator an onium salt of the general formula (11):

$(R)_m JM$                       (11)

wherein R is independently selected from substituted or unsubstituted aromatic groups, J is sulfonium or iodonium, M is a toluenesulfonate or trifluoromethanesulfonate group, and letter m is equal to 2 or 3.

In general, the acid generators which will decompose to generate acid upon exposure to actinic radiation such as deep-UV, electron beams and X-ray include oxime sulfonic acid derivatives, 2,6-dinitrobenzylsulfonic acid derivatives, naphthoquinone-4-sulfonic acid derivatives, 2,4-bistrichloromethyl-6-allyl-1,3,5-triazine derivatives, and α,α'-bisallylsulfonyldiazomethane. However, where the polysiloxane (A) or (B) according to the invention is used as a base polymer, a highly sensitive resist composition cannot be always prepared using these acid generators. In this regard, the onium salts of formula (11) are preferred.

In formula (11), exemplary groups represented by R include tert-butoxyphenyl, tert-butoxycarbonyloxyphenyl, tert-butoxycarbonylmethoxyphenyl, tetrahydropyranyloxyphenyl, and trimethylsiloxyphenyl groups. Preferred among these are tert-butoxyphenyl, tert-butoxycarbonyloxyphenyl, and tert-butoxycarbonylmethoxyphenyl groups. Therefore, onium salts of formula (11) wherein at least one of R groups is such a preferred group are desirable.

Known examples of the onium salt of formula (11) include $(C_6H_5)_2I^{+-}O_3SCF_3$, $(C_6H_5)_3S^{+-}O_3SCF_3$, $(C_6H_5SC_6H_4)(C_6H_5)_2S^{+-}O_3SCF_3$, $(C_6H_5)_2I^{+-}O_3S(C_6H_4)CH_3$, (tert-butyl-$C_6H_4)_2I^{+-}O_3SCF_3$, and $(C_6H_5)(MeOC_6H_5)I^{+-}O_3S(C_6H_4)CH_3$. These photoacid generators, however, are undesirably less soluble in solvents commonly used in preparing a resist solution for coating purposes, such as ethyl cellosolve acetate, ethyl lactate, and ethoxy-2-propanol. Then some of these photoacid generators are difficult to mix an appropriate amount thereof in a resist composition. Among those photoacid generators which are well soluble in solvents, some are difficult to form acceptable resist films because they are incompatible with the polysiloxane (A) or (B) of the invention and some will form resist films which tend to undergo a change with time of sensitivity or pattern profile until the films are heat treated subsequent to light exposure. Especially those photoacid generators which are incompatible with the polysiloxane (A) or (B) of the invention would create a distribution in a resist film, which can cause a perceivable overhang to form at the pattern surface. Such a phenomenon often occurs in chemically amplified resist compositions as a result of deactivation of the acid or depletion of the photoacid generator at the resist film surface.

The use of onium salts of formula (11) wherein at least one R group is a tert-butoxyphenyl or similar group is advantageous because they are well soluble in the commonly used resist solvents and well compatible with the polysiloxane (A) or (B) of the invention. The resulting resist film is well soluble after exposure and allows a resist pattern having a wall perpendicular to the substrate to be defined therein. Differently stated, these onium salts yield a phenolic hydroxyl group or carboxylic acid upon exposure and heat treatment due to the tert-butoxyphenyl or similar group, which will improve solubility after exposure. Although onium salts are generally dissolution inhibitory, these preferred onium salts are effective for promoting dissolution after exposure. This leads to a greater difference in dissolution rate before and after exposure. For this reason, the onium salts of formula (11) wherein at least one R group is a tert-butoxyphenyl or similar group are advantageously used. It is noted that these onium salts tend to be more soluble as more R groups are replaced by acid labile groups.

Examples of the onium salt of formula (11) wherein at least one R group is replaced by an acid labile group are given below. In the structural formulae shown below, t-BuO stands for a tert-butoxy group, THPO for a tetrahydropyranyloxyphenyl group, Tf for a trifluoromethanesulfonate group, and Ts for a toluenesulfonate group.

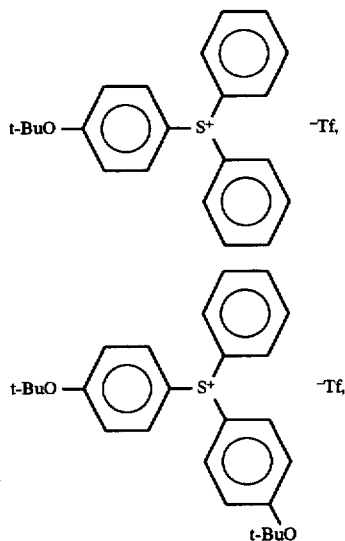

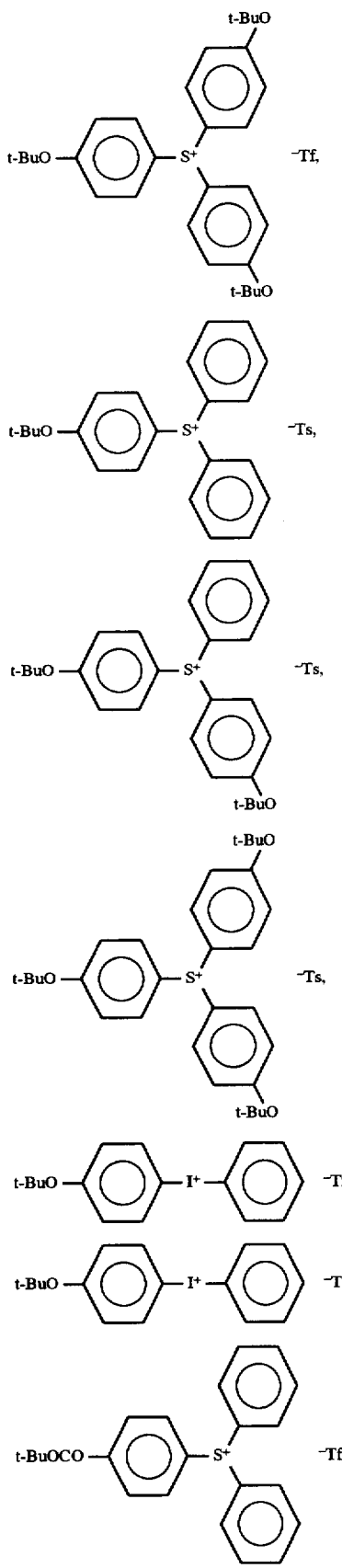

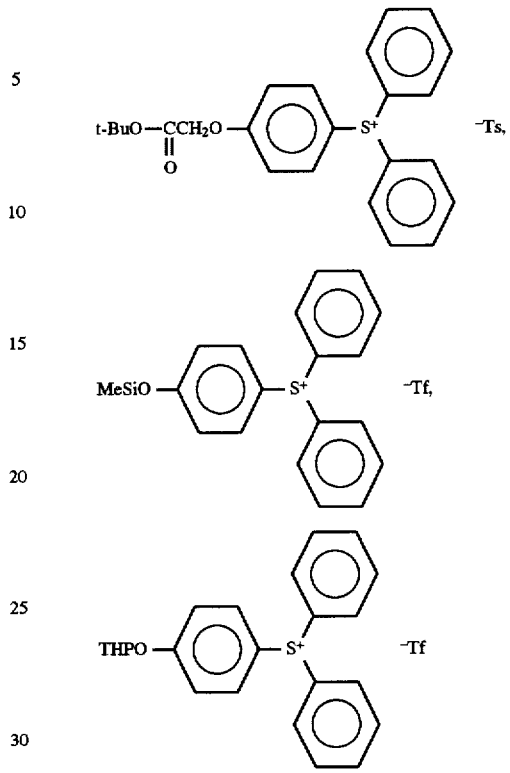

Preferably the onium salt as a photoacid generator is contained in an amount of 0.5 to 15% by weight, especially 1 to 10% by weight of the entire resist composition (exclusive of the solvent). A composition containing less than 0.5% of an onium salt exhibits positive resist performance, but is less sensitive. The resist increases its sensitivity and contrast (γ) as the amount of the onium salt increases. A composition containing more than 15% of an onium salt still exhibits positive resist performance. However, the onium salt content should preferably be 15% or less since no further improvement in sensitivity is expected from excessive contents, the onium salt is an expensive reagent, and an increased content of a low molecular weight component in the resist reduces the mechanical strength and oxygen plasma resistance of a resist film.

The resist composition of the invention is also useful as a three component system comprising a dissolution inhibitor in addition to the polysiloxane and the photoacid generator.

The dissolution inhibitor used herein may be any of low and high molecular weight compounds insofar as they have at least one acid labile group in their molecule. It may be selected from conventional dissolution inhibitors used in well-known positive resists, for example. Examples of the acid labile group are the same as exemplified for R in formula (11). Typical dissolution inhibitors are bisphenol A derivatives wherein hydroxyl groups are converted into tert-BOC groups, and fluoroglucine and tetrahydroxybenzophenone having tert-BOC groups incorporated therein.

Preferably the dissolution inhibitor is contained in an amount of up to 40% by weight, especially 10 to 30% by weight of the entire resist composition (exclusive of the solvent). More than 40% of the dissolution inhibitor would significantly detract from oxygen plasma resistance and restrain use as a two-layer resist.

The resist composition of the invention is prepared by dissolving the polysiloxane (A) or (B), acid generator, and optional dissolution inhibitor in an organic solvent. Use may be made of organic solvents in which these components are soluble and which allow for uniform spreading of a resist film. Examples include butyl acetate, xylene, acetone, cellosolve acetate, ethylene glycol monomethyl ether, diethylene glycol monomethyl ether, diethylene glycol monoethyl ether, ethylene glycol monoethyl ether, diethylene glycol dibutyl ether, diethylene glycol dimethyl ether, ethyl lactate, methyl lactate, propyl lactate, and butyl lactate. Among these, ethyl lactate, butyl lactate, and diethylene glycol monoethyl ether are especially useful. These organic solvents may be used alone or in admixture. The amount of the organic solvent used is several times the total weight of the resist components, polysiloxane (A) or (B), acid generator, and dissolution inhibitor.

If desired, other suitable additives may be blended in the resist composition of the invention insofar as the benefits of the invention are not lost.

A resist pattern may be formed from the resist composition of the invention by a conventional process, for example, by the following procedure.

First a thick layer of organic polymer is formed on a silicon substrate as a lower resist film. The material of the lower resist film may be a novolak resin base positive photoresist composition. It is coated on the substrate and hard baked at 200° C. for one hour for preventing intermixing with the resist composition of the invention to be subsequently coated. After the lower resist film is formed, the resist composition of the invention in solution form is spin coated thereon, pre-baked, and imagewise exposed to actinic radiation. At this point, the photoacid generator decomposes to generate an acid. After exposure, the resist film is baked. During this post-exposure baking (PEB), the acid catalyzes decomposition of an acid labile group such as tert-BOC so that the dissolution inhibitory effect is lost. Thereafter, the resist film is developed with an aqueous alkaline solution and rinsed with water, obtaining a positive resist pattern on the lower resist film.

EXAMPLE

Examples of the present invention are given below by way of illustration and not by way of limitation. All parts are by weight. Synthesis of polysiloxanes as a base polymer is first described.

Synthesis Example 1

Synthesis of p-methoxybenzylsilsesquioxane

A reactor was charged with 600 ml of water. With stirring at 30° C., a mixture of 283.5 g (1 mol) of p-methoxybenzyltrichlorosilane and 300 ml of toluene was added dropwise to water over 2 hours for hydrolysis. By separatory operation, the water layer was removed and the organic layer was distilled of the solvent by means of an evaporator. The concentrate was heated under vacuum at 200° C. for 2 hours for polymerization. The polymer was dissolved in 200 g of acetonitrile. There is obtained a solution of p-methoxybenzylsilsesquioxane.

Synthesis Example 2 (Comparison)

Synthesis-1 of p-hydroxybenzylsilsesquioxane

While the solution obtained in Synthesis Example 1 was kept below 60° C., 240 g of trimethylsilyl iodide was added dropwise thereto and reaction was effected at 60° C. for 10 hours. After the completion of reaction, 200 g of water was added to the reaction solution for hydrolysis. The polymer layer was collected by decantation and dried in vacuum, obtaining 165 g of p-hydroxybenzylsilsesquioxane. On analysis by gel permeation chromatography (GPC), the polymer had a weight average molecular weight Mw of 3,000 calculated as polystyrene. On $^{29}$Si-NMR analysis, a peak attributable to an SiOH group was observed at −62 ppm.

Synthesis Example 3 (Comparison)

Synthesis-2 of p-hydroxybenzylsilsesquioxane

The polymer obtained in Synthesis Example 1 was dissolved in 200 g of methylene chloride instead of acetonitrile. After the solution was cooled to −80° C., with stirring, 250 g (1 mol) of boron tribromide in 600 ml of methylene chloride was slowly added dropwise thereto over 10 hours. After the completion of addition, the solution was aged for 2 hours at −80° C., then allowed to slowly resume room temperature, and aged at room temperature for one day. After the completion of reaction, 1 liter of water was added to the reaction solution with stirring. The mixture separated into water and organic layers. The organic layer was washed with water until the wash water became neutral. After the solvent was removed, the residue was dissolved in methanol and then added to water, obtaining a white precipitate. The precipitate was dried in vacuum, collecting 134 g of p-hydroxybenzylsilsesquioxane. On GPC analysis, the polymer had a Mw of 2,900 calculated as polystyrene. On $^{29}$Si-NMR analysis, a peak attributable to an SiOH group was observed at −62 ppm. A comparison of the peak of SiOH group with a peak of silsesquioxane at −70 ppm revealed that more SiOH groups were present than in the p-hydroxybenzylsilsesquioxane of Synthesis Example 2.

Synthesis Example 4

Synthesis-3 of p-hydroxybenzylsilsesquioxane

The polymer obtained in Synthesis Example 1 was dissolved in 200 g of toluene instead of acetonitrile. The solution, to which 80 g of hexamethyldisilazane was added, was heated under reflux for 5 hours. The reaction solution was cooled and stripped of the toluene, and the residue was dissolved in 200 g of acetonitrile. As in Synthesis Example 2, the solution was reacted with trimethylsilyl iodide and then subject to hydrolysis, yielding 160 g of p-hydroxybenzylsilsesquioxane. On GPC analysis, the polymer had a Mw of 3,200 calculated as polystyrene. On $^{29}$Si-NMR analysis, a peak attributable to an SiOH group was observed at −62 ppm, but was very low.

Synthesis Example 5

Introduction of tert-butoxycarbonyl (tert-BOC) into the polymer of Synthesis Example 4

In 250 g of pyridine was dissolved 25 g of the polymer of Synthesis Example 4. With stirring at 45° C., 6.85 g (0.031 mol, corresponding to about 20 mol % based on hydroxyl group) of di-tert-butyl dicarbonate was added. Gas evolved at the same time as addition and reaction was effected in a nitrogen gas stream for 1½ hours. The reaction solution was stripped of the pyridine, dissolved in 100 ml of methanol, and added dropwise to 5 liters of water, yielding a white precipitate. The precipitate was washed 5 times with water, filtered, and dried in vacuum below 40° C., collecting 25 g of tert-butoxycarbonylated p-hydroxybenzylsilsesquioxane. The product was analyzed by $^1$H-NMR. From a peak of phenyl at 6 to 7 ppm and peaks of tert-butyl and methylene at 1 to 2 ppm, the tert-BOC introduction rate was calculated to be 19.6%.

Synthesis Example 6 (Comparison)

Introduction of tert-butoxycarbonyl (tert-BOC) into the polymer of Synthesis Example 2

As in Synthesis Example 5, a tert-butoxycarbonyl group was introduced into the polymer of Synthesis Example 2.

Synthesis Example 7 (Comparison)

Introduction of tert-butoxycarbonyl (tert-BOC) into the polymer of Synthesis Example 3

As in Synthesis Example 5, a tert-butoxycarbonyl group was introduced into the polymer of Synthesis Example 3.

Synthesis Example 8

Trimethylsilylation of p-hydroxybenzylsilsesquioxane

In 400 ml of toluene, 159.2 g of p-hydroxybenzylsilsesquioxane of Synthesis Example 2 was dissolved and 22.3 g (0.17 mol) of hexamethyldisilazane was added. The solution was heated under reflux for 3 hours. The toluene was then stripped off in vacuum. The residue was dried in vacuum, obtaining 22.4 g of a polymer of trimethylsilylated p-hydroxybenzylsilsesquioxane. The product was analyzed by $^1$H-NMR. From a peak of phenyl at 6 to 7 ppm and a peak of trimethylsilyl at 0 ppm, the trimethylsilyl introduction rate was calculated to be about 10%. On $^{29}$Si-NMR analysis, the peak attributable to SiOH group at −62 ppm was not observed, but only the peak of silsesquioxane at −70 ppm was observed.

Synthesis Example 9

Introduction of tert-butoxycarbonyl (tert-BOC) into the polymer of Synthesis Example 8

In 250 g of pyridine was dissolved 25 g of the polymer of Synthesis Example 8. With stirring at 45° C., 6.85 g (0.031 mol, corresponding to about 20 mol % based on hydroxyl group) of di-tert-butyl dicarbonate was added. Gas evolved at the same time as addition and reaction was effected in a nitrogen gas stream for 1½ hours. The reaction solution was stripped of the pyridine, dissolved in 100 ml of methanol, and added dropwise to 5 liters of water, yielding a white precipitate. The precipitate was washed 5 times with water, filtered, and dried in vacuum below 40° C., collecting 25 g of tert-butoxycarbonylated p-hydroxybenzylsilsesquioxane. The product was analyzed by $^1$H-NMR. From a peak of phenyl at 6 to 7 ppm and peaks of tert-butyl and methylene at 1 to 2 ppm, the tert-BOC introduction rate was calculated to be 19.6%.

Example 1

A resist solution was prepared from the following ingredients and passed through a filter of 0.1 μm mesh.

|  | pbw |
| --- | --- |
| Base resin (Synthesis Example 5) | 96 |
| Tri(p-tert-butoxyphenyl)sulfonium triflate | 4 |
| N-methylpyrrolidone | 0.4 |
| 1-ethoxy-2-propanol | 600 |

The resist solution was spin coated onto a silicon substrate at 2,000 rpm and pre-baked on a hot plate at 85° C. for one minute, obtaining a film of 0.4 μm thick. The resist film was exposed imagewise to a KrF excimer laser beam or an electron beam at an accelerating voltage of 30 kV, baked (PEB) at 85° C. for 2 minutes, and developed with an aqueous solution of 2.4% tetramethylammonium hydroxide (TMAH) for one minute, and rinsed with water for 30 seconds.

The resist film was positive working and had a $D_0$ sensitivity of 4.5 μC/cm$^2$. The film had an Eth sensitivity of 10 mJ/cm$^2$ as evaluated using a KrF excimer laser beam (wavelength 248 nm) as deep-UV radiation instead of the electron beam. The base resin used herein had a dissolution rate of 35 nm/s in the developer. The resist film had a dissolution rate of about 1.5 nm/s in unexposed areas and a dissolution rate of 40 nm/s in exposed areas after PEB.

Upon imagewise exposure with the KrF excimer laser beam, a 0.25 μm line-and-space pattern and a hole pattern could be resolved and a pattern having a side wall perpendicular to the substrate was formed. Upon imagewise exposure with the electron beam, a resolution to 0.1 μm was possible.

The resist solution was examined for shelf stability by counting the number of particles with a diameter of more than 0.3 μm per milliliter. Immediately after preparation and filtration, the resist solution contained 10 particles/ml. After storage for 1 and 2 months at room temperature, the resist solution contained 20 particles/ml and 24 particles/ml, respectively. It was observed that the number of particles in the resist solution showed no significant change during storage. For the aged resist solutions, parity results were obtained with respect to the sensitivity, resolution and other properties of a resist film.

Comparative Example 1

A resist solution was prepared as in Example 1 except that the polymer of Synthesis Example 6 was used instead of the polymer of Synthesis Example 5.

Immediately after the resist solution was prepared, a resist film thereof showed equivalent properties to the resist film of Example 1. After storage for 1 month at room temperature, the number of particles with a diameter of more than 0.3 μm in the resist solution exceeded 3,000 particles/ml. When a resist film obtained from the aged resist solution was exposed to a KrF excimer laser beam, its Eth sensitivity dropped to 13 mJ/cm$^2$ and its resolution limit was a 0.35 μm line-and-space pattern. After the resist solution was stored for 2 months, the number of particles increased beyond the measurement limit.

Comparative Example 2

A resist solution was prepared as in Example 1 except that the polymer of Synthesis Example 7 was used instead of the polymer of Synthesis Example 5.

Immediately after the resist solution was prepared, a resist film thereof showed equivalent properties to the resist film of Example 1. After the resist solution was stored at room temperature for 1 month, the number of particles increased beyond the measurement limit.

Example 2

On a silicon wafer, OFPR800 (commercially available from Tokyo Oka K.K.) was coated to a thickness of 2 μm and heated at 200° C. for one hour for curing into a lower resist film. On the lower resist film, the resist solution of Example 1 was coated to a thickness of about 0.4 μm and prebaked in the same manner as in Example 1. As in Example 1, the upper resist film was exposed imagewise to an electron beam or KrF excimer laser beam and developed, forming a resist pattern on the lower resist film.

Thereafter, etching was carried out by means of a parallel plate sputter etching apparatus using oxygen gas as an etchant gas. The etching conditions included a gas flow rate of 50 SCCM, a gas pressure of 1.3 Pa, an RF power of 50 W, and a DC bias voltage of 450 V. The lower resist film was etched at a rate of 150 nm/min. and the resist film of the composition of Example 1 was etched at a rate of less than 2.5 nm/min. After 15 minutes of etching, that portion of the lower resist film which was not covered with the resist film of Example 1 was completely etched away, leaving a two-layer resist pattern having a thickness of more than 2 µm. A pattern of 0.25 µm was formed from KrF exposure and a pattern of 0.1 µm was formed from electron exposure, both at a high aspect ratio.

Example 3

A resist solution was prepared from the following ingredients and passed through a filter of 0.1 µm mesh.

|  | pbw |
| --- | --- |
| Base resin (Synthesis Example 9) | 96 |
| Tri(p-tert-butoxyphenyl)sulfonium triflate | 4 |
| N-methylpyrrolidone | 0.4 |
| 1-ethoxy-2-propanol | 600 |

The resist solution was spin coated onto a silicon substrate at 2,000 rpm and pre-baked on a hot plate at 85° C. for one minute, obtaining a film of 0.4 µm thick. The resist film was exposed imagewise to a KrF excimer laser beam or an electron beam at an accelerating voltage of 30 kV, baked (PEB) at 85° C. for 2 minutes, and developed with an aqueous solution of 2.4% tetramethylammonium hydroxide (TMAH) for one minute, and rinsed with water for 30 seconds.

The resist film was positive working and had a $D_0$ sensitivity of 4.5 µC/cm². The film had an Eth sensitivity of 10 mJ/cm² as evaluated using a KrF excimer laser beam (wavelength 248 nm) as deep-UV radiation instead of the electron beam. The base resin used herein had a dissolution rate of 35 nm/s in the developer. The resist film had a dissolution rate of about 1.5 nm/s in unexposed areas and a dissolution rate of 40 nm/s in exposed areas after PEB.

Upon imagewise exposure with the KrF excimer laser beam, a 0.25 µm line-and-space pattern and a hole pattern could be resolved and a pattern having a side wall perpendicular to the substrate was formed. Upon imagewise exposure with the electron beam, a resolution to 0.1 µm was possible.

The resist solution was examined for shelf stability by counting the number of particles with a diameter of more than 0.3 µm per milliliter. Immediately after preparation and filtration, the resist solution contained 10 particles/ml. After storage for 1 and 2 months at room temperature, the resist solution contained 20 particles/ml and 24 particles/ml, respectively. It was observed that the number of particles in the resist solution showed no significant change during storage. For the aged resist solutions, parity results were obtained with respect to the sensitivity, resolution and other properties of a resist film.

Example 4

On a silicon wafer, OFPR800 (commercially available from Tokyo Oka K.K.) was coated to a thickness of 2 µm and heated at 200° C. for one hour for curing into a lower resist film. On the lower resist film, the resist solution of Example 3 was coated to a thickness of about 0.4 µm and prebaked in the same manner as in Example 3. As in Example 3, the upper resist film was exposed imagewise to an electron beam or KrF excimer laser beam and developed, forming a resist pattern on the lower resist film.

Thereafter, etching was carried out by means of a parallel plate sputter etching apparatus using oxygen gas as an etchant gas. The etching conditions included a gas flow rate of 50 SCCM, a gas pressure of 1.3 Pa, an RF power of 50 W, and a DC bias voltage of 450 V. The lower resist film was etched at a rate of 150 nm/min. and the resist film of the composition of Example 3 was etched at a rate of less than 2.5 nm/min. After 15 minutes of etching, that portion of the lower resist film which was not covered with the resist film of Example 3 was completely etched away, leaving a two-layer resist pattern having a thickness of more than 2 µm. A pattern of 0.25 µm was formed from KrF exposure and a pattern of 0.1 µm was formed from electron exposure, both at a high aspect ratio.

There has been described a chemically amplified positive resist composition which is sensitive to actinic radiation and improved in sensitivity, resolution, PEB delay stability, and oxygen plasma etching resistance. The resist composition of the invention is coated onto a lower resist film to form a two-layer resist film which is characterized by fine pattern definition at a high aspect ratio. Therefore, the composition lends itself to fine processing using electron and deep-UV radiation. The chemically amplified positive resist composition is low absorptive at the exposure wavelength of a KrF excimer laser so that a fine resist pattern having a side wall perpendicular to the substrate can be readily formed.

Japanese Patent Application Nos. 103124/1995 and 103125/1995 are incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified positive resist composition comprising a polysiloxane (A) having a terminal silanol group protected with a trimethylsilyl group of the general compositional formula (1):

$$R^1(OSiMe_3)_aSiO_{(3-a)/2} \tag{1}$$

wherein $R^1$ is a monovalent organic group selected from the group consisting of

with proviso that at least one of the $R^1$s is

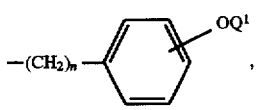

Me is a methyl group, $Q^1$ is an acid labile group, letter a is a positive number in the range of from 0.001 to 0.05, and letter n is equal to 1, 2 or 3, and a photoacid generator.

2. The composition of claim 1 wherein said polysiloxane (A) has a weight average molecular weight of 5,000 to 50,000.

3. The composition of claim 1 wherein said polysiloxane (A) is obtained by reacting a polysiloxane composed of the recurring unit of the general formula (3):

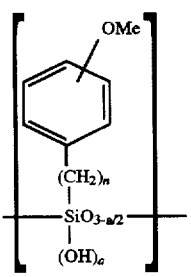
(3)

wherein Me, a and n are as defined above with hexamethyldisilazane or trimethylsilyl chloride for trimethylsilylating the hydrogen atom of a silanol group thereof, reacting the resulting polysiloxane with trimethylsilyl iodide for substituting a trimethylsilyl group for the methyl group of the methoxy group thereof, hydrolyzing the resulting polysiloxane into a polysiloxane having phenolic hydroxyl groups composed of the recurring unit of the general formula (6):

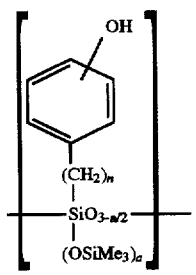
(6)

wherein Me, a and n are as defined above, and substituting acid labile groups for some of the phenolic hydroxyl groups of the polysiloxane composed of the recurring unit of formula (6).

4. The composition of claim 1 wherein the photoacid generator is an onium salt of the general formula (11):

$(R)_m JM$ (11)

wherein R is independently selected from substituted or unsubstituted aromatic groups, J is sulfonium or iodonium, M is a toluenesulfonate or trifluoromethanesulfonate group, and letter m is equal to 2 or 3.

5. The composition of claim 1 further comprising a dissolution inhibitor.

6. A chemically amplified positive resist composition comprising a polysiloxane (B) having a terminal silanol group protected with a trimethylsilyl group of the general compositional formula (2):

$R^2(OSiMe_3)_a SiO_{(3-a)/2}$  2)

wherein $R^2$ is a monovalent organic group selected from the group consisting of

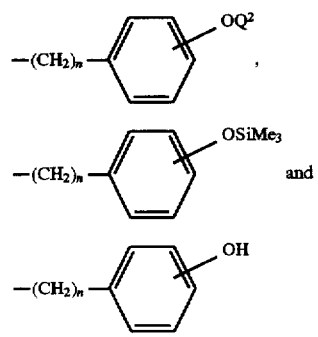

with proviso that at least one of the $R^2$s is

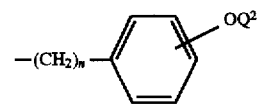

and at least one of the $R^2$s is

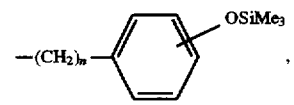

Me is a methyl group, $Q^2$ is an acid labile group excluding a trimethylsilyl group, letter a is a positive number in the range of from 0.001 to 0.05, and letter n is equal to 1, 2 or 3, and a photoacid generator.

7. The composition of claim 6 wherein said polysiloxane (B) has a weight average molecular weight of 5,000 to 50,000.

8. The composition of claim 6 wherein said polysiloxane (B) is obtained by reacting a polysiloxane composed of the recurring unit of the general formula (7):

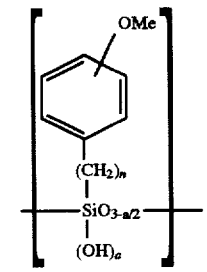
(7)

wherein Me, a and n are as defined above with trimethylsilyl iodide for trimethylsilylating a silanol group thereof and substituting a trimethylsilyl group for the methyl group of the methoxy group thereof, hydrolyzing the resulting polysiloxane to introduce phenolic hydroxyl groups, reacting the resulting polysiloxane with hexamethyldisilazane or trimethylsilyl chloride for trimethylsilylating some of the hydrogen atoms of the phenolic hydroxyl groups and trimethylsilylating the hydrogen atoms of residual silanol groups, thereby obtaining a polysiloxane composed of the recurring units of the general formulae (10a) and (10b):

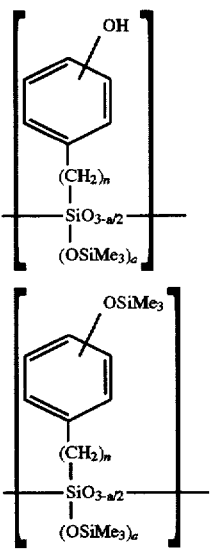

(10a)

(10b)

wherein Me, a and n are as defined above, and
substituting acid labile groups for some of the residual phenolic hydroxyl groups of the polysiloxane composed of the recurring units of formulae (10a) and (10b).

9. The composition of claim 6 wherein the photoacid generator is an onium salt of the general formula (11):

$(R)_m JM$  (11)

wherein R is independently selected from substituted or unsubstituted aromatic groups, J is sulfonium or iodonium, M is a toluenesulfonate or trifluoromethanesulfonate group, and letter m is equal to 2 or 3.

10. The composition of claim 6 further comprising a dissolution inhibitor.

11. The composition of claim 1, wherein the acid labile group, $Q^1$, is tert-butyl, tert-butoxycarbonyl or tert-butoxycarbonylmethyl.

12. The composition of claim 1, wherein 5 to 50 mol % of the $R^1$ groups contain the acid labile group $Q^1$.

13. The composition of claim 6, wherein the acid labile group, $Q^2$, is tert-butyl, tert-butoxycarbonyl or tert-butoxycarbonylmethyl.

14. The composition of claim 6, wherein 5 to 50 mol % of the $R^2$ groups contain the acid labile group $Q^2$.

15. The composition of claim 1, wherein the composition contains at least 55% by weight of the polysiloxane (A).

16. The composition of claim 6, wherein the composition contains at least 55% by weight of the polysiloxane (B).

17. The composition of claim 4, wherein in formula (11) R is tert-butoxyphenyl, tert-butoxycarbonyloxyphenyl, tert-butoxycarbonylmethoxyphenyl, tetrahydropyranyloxyphenyl or trimethylsiloxyphenyl.

18. The composition of claim 9, wherein in formula (11) R is tert-butoxyphenyl, tert-butoxycarbonyloxyphenyl, tert-butoxycarbonylmethoxyphenyl, tetrahydropyranyloxyphenyl or trimethylsiloxyphenyl.

19. The composition of claim 4, wherein in formula (11) at least one R group is tert-butoxyphenyl.

20. The composition of claim 9, wherein in formula (11) at least one R group is tert-butoxyphenyl.

* * * * *